United States Patent [19]
Kuriyama et al.

[11] Patent Number: 5,771,808
[45] Date of Patent: Jun. 30, 1998

[54] STAMP MATERIAL, STAMP MAKING METHOD USING THE STAMP MATERIAL AND STAMP MANUFACTURED BY THE STAMP MAKING METHOD

[75] Inventors: Hiroshi Kuriyama; Youichi Kodaira, both of Nagano-ken, Japan

[73] Assignee: Seiko Epson Corporation, Tokyo, Japan

[21] Appl. No.: 682,749

[22] PCT Filed: Nov. 21, 1995

[86] PCT No.: PCT/JP95/02373

§ 371 Date: Nov. 12, 1996

§ 102(e) Date: Nov. 12, 1996

[87] PCT Pub. No.: WO96/15909

PCT Pub. Date: May 30, 1996

[30] Foreign Application Priority Data

Nov. 24, 1994 [JP] Japan .................................. 6-289424

[51] Int. Cl.⁶ .................................................. B41K 1/34
[52] U.S. Cl. .................................... 101/401.1; 430/905
[58] Field of Search ...................... 101/401.1; 430/269, 430/270.1, 270.13, 271.1, 903

[56] References Cited

U.S. PATENT DOCUMENTS

| | | | |
|---|---|---|---|
| 3,615,450 | 10/1971 | Werber et al. | 101/401.1 |
| 3,806,575 | 4/1974 | Fishburn | 101/401.1 |
| 4,323,637 | 4/1982 | Chen et al. | 430/905 |
| 4,423,135 | 12/1983 | Chen et al. | 430/905 |
| 4,714,957 | 12/1987 | Takano | 101/401.1 |
| 4,985,301 | 1/1991 | Butter et al. | 101/401.1 |
| 5,085,514 | 2/1992 | Mallik et al. | 359/2 |

FOREIGN PATENT DOCUMENTS

| | | |
|---|---|---|
| 5-85027 | 4/1993 | Japan . |
| 6-278350 | 10/1994 | Japan . |

*Primary Examiner*—Eugene H. Eickholt
*Attorney, Agent, or Firm*—Harness, Dickey & Pierce, P.L.C.

[57] ABSTRACT

There are provided a stamp material from which a stamp can be simply made and which, in particular, permits the unexposed portion of a photoconductive resin to be easily removed in a making process, a stamp making method and a stamp. The stamp material comprises a face of a seal forming member having a photosensitive resin which is changed from a liquid to a solid in response to a received light and a stamp stock for holding the face of a seal forming member. With this arrangement, the portion of the photoconductive resin to which a light is irradiated is cured and adhered to the stamp stock and the portion thereof to which the light is not irradiated flows out or can be simply exfoliated without being cured.

33 Claims, 6 Drawing Sheets

STAMP MATERIAL, STAMP MAKING METHOD USING THE STAMP MATERIAL AND STAMP MANUFACTURED BY THE STAMP MAKING METHOD

TECHNICAL FIELD

The present invention relates to a stamp material suitable for simply obtaining a seal having a desired print of seal, a stamp and the like. Further, the present invention relates to a stamp making method using the stamp material and a stamp obtained by the method.

BACKGROUND ART

Conventionally, there is commercially available an apparatus called a seal making apparatus or a stamp making apparatus by which seals and stamps such rubber stamps and the like (which are referred to as "stamps" as a whole in the specification) can be easily made even by persons other than specialists. A stamp material used to these apparatuses is composed of a face of a seal forming member and a stamp stock for holding it and they are prepared as separate members. The face of a seal forming member is composed of a base member and an ultraviolet rays curing resin secured to the base member and a face of a seal is formed by the ultraviolet rays curing resin. Although the ultraviolet rays curing resin has a predetermined hardness and brittleness in a steady state, the resin has such a property that when the resin is irradiated with ultraviolet rays, it has an increased hardness and is provided with toughness. Although the ultraviolet rays curing resin is soluble to water in the steady state it is made insoluble to water by being irradiated with the ultraviolet rays.

When a stamp is made using the stamp material, there is previously prepared a negative film to which a desired image of a seal is photographed by making use of an exposure unit of the apparatus and ultraviolet rays are exposed to the ultraviolet rays curing resin of the stamp material using the negative film as a mask. Since the portion of the ultraviolet rays curing resin corresponding to the image of the seal is cured by the exposure, the uncured portion of the ultraviolet rays curing resin is scraped off and washed away in water by a brush. It is preferable to irradiate ultraviolet rays to the ultraviolet rays curing resin again to thereby stabilize the face of a seal and thereafter the stamp is finished by mounting the face of a seal forming member on a stamp stock.

In the above conventional stamp making method, however, even the uncured portion of the ultraviolet rays curing resin has a predetermined hardness and brittleness, even if the uncured portion is washed away while being softened in water, a long time is needed as well as a complex job is required to perfectly wash away the uncured portion up to its minute parts. Moreover, when there is also a problem that the cured portion may be damaged by being excessively rubbed with the brush or the like when a worker is not accustomed with the job and further there is a possibility that the rough surface of the cured portion to which ink is to be adhered (through which ink is placed on the face of the seal without being shed) may be ground smoothly.

Thus, an object of the present invention is to provide a stamp material which permits the uncured portion of a photosensitive resin cured by a light to be simply removed without the need of skill while remaining the cured portion thereof without damaging it, a stamp making method using the stamp material and a stamp manufactured by the stamp making method.

DISCLOSURE OF THE INVENTION

An invention of a stamp material of claim 1 is characterized by a face of a seal forming member having a photosensitive resin which is changed from a liquid to a solid in response to a received light and a stamp stock for holding the face of a seal forming member. According to the arrangement, the photoconductive resin is the liquid before it is irradiated with the light and changed to the solid after the light is irradiated. Thus, when a face of a seal is arranged by subjecting the portion of the photoconductive resin corresponding to the image of a print of seal, the portion of the face of the seal is cured and the portion other than the face of the seal flows out. As a result, the portion other than the face of the seal can be easily removed from the portion of the face of the seal. Note, the "stamp stock" is a generally used name and does not indicate the material thereof and is usually composed of resin, metal or wood.

Preferably, the face of a seal forming member includes a cover member for forming a filling space capable of being filled with the photosensitive resin in a water tight state between the face of a seal forming member and the stamp stock and the cover member is composed of a light transmitting material and detachably attached to the stamp stock. According to the arrangement, before the face of the seal is arranged by the execution of an exposure, the liquid photoconductive resin is properly held to the stamp stock by the cover member without flowing out and after the face of the seal is arranged by the execution of the exposure, the portion other than the face of the seal is caused to flow out by the removal of the cover member.

Preferably, the face of a seal forming member further includes a light shading cap member detachably covering the cover member. According to the arrangement, since the photoconductive resin is shaded by the cap member when the stamp material is transported or stored, the liquid photoconductive resin is neither cured nor deteriorated.

Preferably, the contact surface of the stamp stock and the contact surface of the cover member are arranged such that the adhering force of the photosensitive resin having changed to the solid to the contact surface of the stamp stock is greater than that of the photoconductive resin to the contact surface of the cover member. According to the arrangement, when the face of the seal is arranged by executing the exposure and the cover member is removed, a portion corresponding to the cured face of the seal remains by being securely adhered to the stamp stock.

In the invention of the stamp member of claim 1, the face of a seal forming member is preferably held by the stamp stock through a light transmitting filling vessel filled with the photoconductive resin in a water tight state and the filling vessel includes a vessel base portion attached to the stamp stock and a vessel main body detachable from the vessel base portion. According to the arrangement, before the face of the seal is arranged by the execution of an exposure, the liquid photoconductive resin is properly held to the stamp stock by the filling vessel without flowing out and after the face of the seal is arranged by the execution of the exposure, the portion other then the face of the seal is caused to flow out by the removal of the vessel main body. Further, the filling vessel permits the photoconductive resin to be handled easily.

Preferably, the light is ultraviolet rays and the photoconductive resin is composed of an ultraviolet rays curing resin. According to the arrangement, since the liquid photoconductive resin is difficult to be cured by a usual room light or the like, it can be easily handled.

Preferably, an elastic member is interposed between a stamp. According to the arrangement, when the stamp material is finished as a stamp, the stamp is provided with excellent operability and feeling of operation.

An invention of a stamp material of claim 13 is characterized by a face of a seal forming member having a photosensitive resin which is changed from a gel to a solid in response to a received light and a stamp stock for holding the face of a seal forming member. According to the arrangement, the uncured portion of the photoconductive resin other then the face of the seal can be easily removed by being exfoliated while remaining the portion of the cured face of the seal. Moreover, no trouble is caused to the handling of the stamp material even if there is no cover and vessel to be filled with the photoconductive resin.

An invention of a stamp making method of claim 18 executed by using a stamp material comprising a face of a seal forming member having a photosensitive resin which is changed from a liquid to a solid in response to a received light and a stamp stock for holding the face of a seal forming member is characterized by an exposing step for subjecting the photoconductive resin to an exposure having a shape corresponding to the image of a print of seal and changing the exposed portion of the photoconductive resin from the liquid to the solid and a removing step for removing the unexposed portion of the photoconductive resin while remaining the exposed portion changed to the solid. According to the arrangement, since the unexposed portion of the photoconductive resin remains in the state of the liquid, the unexposed portion can be simply removed by being caused to flow out.

Preferably, the exposing step executes the exposure using a negative film on which the image of the print of seal is formed as a mask. According to the arrangement, the portion of the photoconductive resin corresponding to the image of the print of seal can be properly exposed to a light as well as the exposure can be executed by a simple arrangement of an apparatus.

An invention of a stamp making method of claim 21 executed by using a stamp material comprising a face of a seal forming member having a photosensitive resin which is changed from a gel to a solid in response to a received light and a stamp stock for holding the face of a seal, forming member is characterized by an exposing step for subjecting the photoconductive resin to an exposure having a shape corresponding to the image of a print of seal and changing the exposed portion from the gel to the solid and a removing step for removing the unexposed portion of the photoconductive resin while remaining the exposed portion changed to the solid. According to the arrangement, since the unexposed portion of the photoconductive resin remains in the state of the gel, the unexposed portion can be simply removed by being exfoliated.

An invention of a stamp of claim 24 is characterized in that a face of a seal is composed of a photoconductive resin which is changed from a liquid to a solid by being subjected to an exposure having a shape corresponding to the image of a print of seal. According to the arrangement, the stamp can be simply manufactured.

An invention of a stamp of claim 25 is characterized in that a face of a seal is composed of a photoconductive resin which is changed from a gel to a solid by being subjected to an exposure having a shape corresponding to the image of a print of seal. According to the arrangement, the stamp can be simply manufactured.

BEST MODE FOR CARRYING OUT THE INVENTION

Preferable embodiments of the present invention will be described below with reference to drawings.

Figure 1:
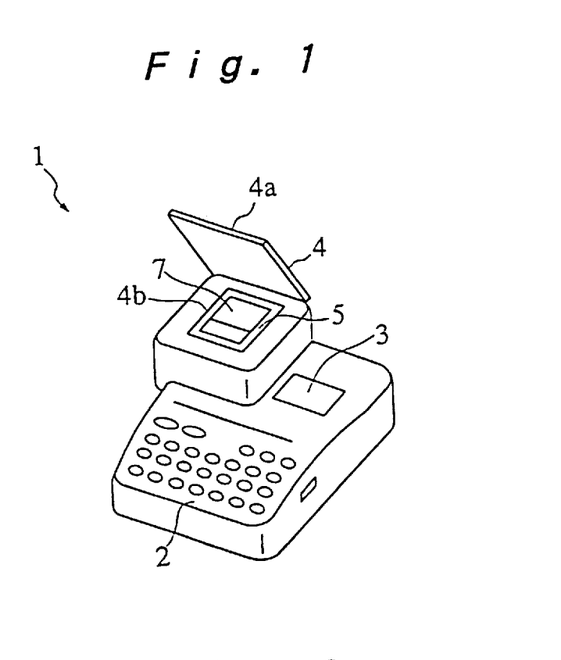
FIG. 1 is an outside perspective view of a stamp making apparatus to which a stamp material and a stamp making method according to an embodiment of the present invention are applied.
Figure 2:
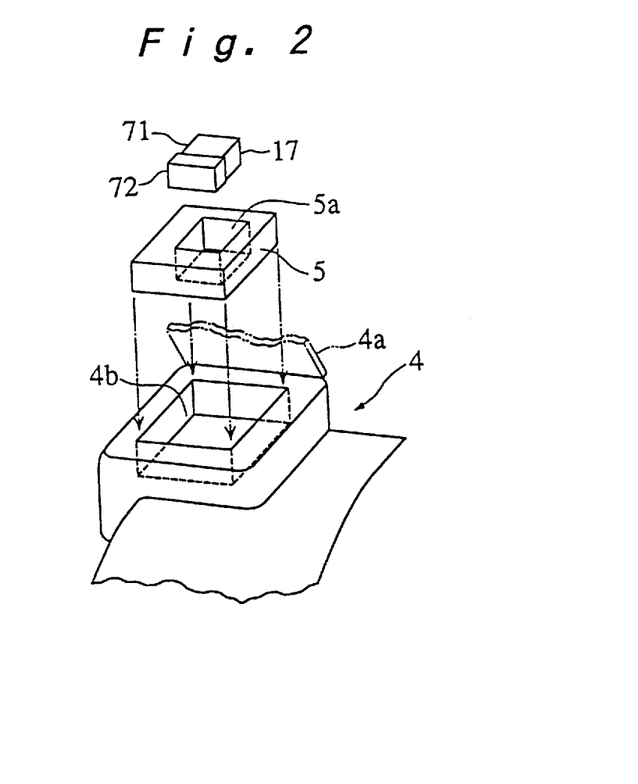
FIG. 2 is a perspective view partly in cross section showing how a cartridge and a stamp making unit are mounted to a ribbon cartridge mounting unit of FIG. 1.

FIG. 1 and FIG. 2 show the outside arrangement of a stamp making apparatus to which the present invention can be applied. As shown in these drawings, the stamp making apparatus 1 is composed of a key input unit 2 for inputting desired characters, a display unit 3 for displaying input characters and the like and a ribbon cartridge mounting unit 4. The ribbon cartridge mounting unit 4 includes an open/close lid 4a and a rectangular mounting recess 4b formed in the ribbon cartridge mounting unit 4 is exposed by opening the open/close lid 4a. A rectangular ribbon cartridge 5 can be mounted to the mounting recess 4b.

As shown in FIG. 2, the ribbon cartridge 5 has a rectangular pocket 5a formed at the center thereof and a stamp making unit 7 as a stamp material is mounted to the pocket 5a. An ink ribbon and a print paper ribbon to be described later are contained in the ribbon cartridge 5 escaped from the pocket 5a.

Next, the arrangements of the ribbon cartridge mounting unit 4 and the ribbon cartridge 5 will be described with reference to FIG. 3. The ribbon cartridge 5 includes an unwinding reel 53 for unwinding the ink ribbon 52 and a winding reel 58 for winding the ink ribbon 52 which are accommodated in a cartridge case 51 having a certain thickness and further includes a print paper reel 55 for unwinding the print paper ribbon 54. The ink ribbon 52 is unwound from the unwinding reel 53, introduced to a printing position 57 by being guided by a guide 56 and the like, further introduced along a case inner peripheral wall 51b from an exposure position 60 and wound around the winding reel 58. Note, the winding reel 58 has a drive shaft disposed on the mounting recess 54 side of the ribbon cartridge mounting unit 4 and the winding reel 58 is engaged with the drive shaft by mounting the ribbon cartridge 5 to the mounting recess 4b.

On the other hand, the print paper ribbon 54 is unwound from the print paper reel 55, introduced to the printing position 57 in the state that it is overlapped with the ink ribbon 52 and further introduced to the outside through a discharge port 51a formed to a side of the cartridge case 51. A discharge port 4c is also formed to the apparatus main body at a position extending from the discharge port 51a so that the print paper ribbon 54 is fed to the outside of the apparatus through the discharge port 4c. A manual cutter 4d is disposed in the vicinity of the discharge port 4c and executes cutting operation when a cutter button 4e disposed at a position adjacent to the cutter 4d is pressed. The print paper ribbon fed to the outside of the apparatus is cut to a predetermined length by the cutter 4d.

A thermal transfer print head 57a and a platen roller 57b are disposed at the printing position 57 in confrontation with each other. The print head 57a is disposed on the mounting recess 4b side of the ribbon cartridge mounting unit 4 and placed in the rectangular case 51 passing through the cartridge case 51 of the ribbon cartridge 5. The platen roller 57b has a roller mounted on the ribbon cartridge 5 side and the drive shaft thereof is mounted on the mounting recess 4b side. With this arrangement, when the ribbon cartridge 5 is mounted to the mounting recess 4b, the print head 57a confronts the platen roller 57b through a minute interval defined therebetween as well as the platen roller 57b is rotatably engaged with the drive shaft thereof.

An exposure position 60 is located at a portion along a side of the inner peripheral wall 51b of the cartridge case 51 and a pair of guides 61, 62 are disposed on the both ends of the inner peripheral wall 51b. An ultraviolet rays irradiating light source 63 as an exposure means is disposed the side of an apparatus main body so that it confronts the ink ribbon 53 stretched between the pair of the guides 61, 62 in parallel therewith. Further, an ultraviolet rays transmitting ribbon press sheet 65 is interposed between the ink ribbon 53 and the ultraviolet rays irradiating light source 63 in parallel with the ink ribbon 53.

Figure 3:
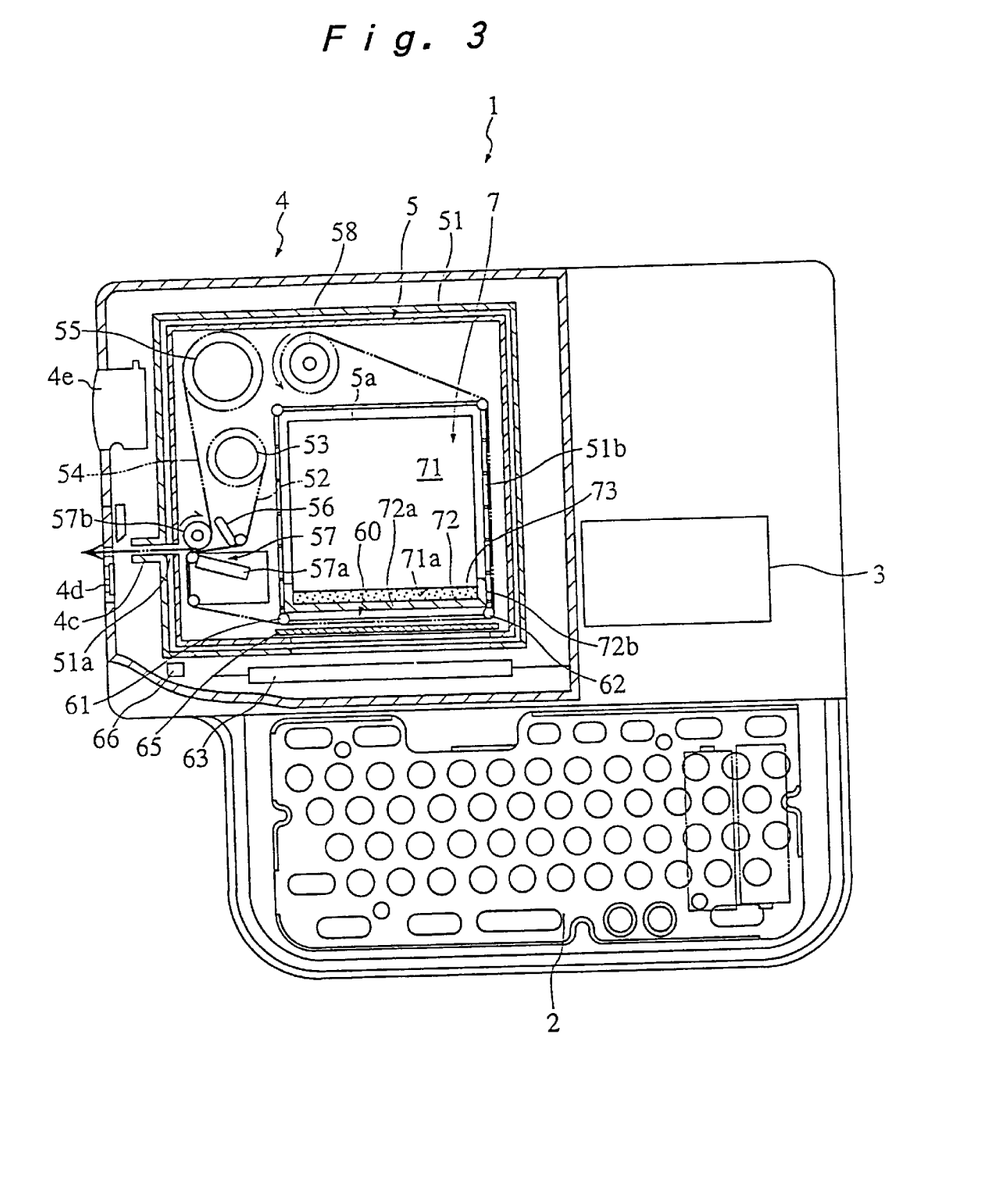
FIG. 3 is an enlarged plan view showing the arrangement of the cartridge mounting unit of FIG. 1 and the ribbon cartridge mounted to the cartridge mounting unit.

The ribbon press sheet 65 is disposed on, for example, the mounting recess 4b side of the stamp making apparatus 1 and when the ribbon cartridge 5 is mounted, the ribbon press sheet 65 is located at a position slightly nearer to the ultraviolet rays irradiating light source 63 as compared with the pair of the guides 61, 62 as shown in FIG. 3. The ribbon press sheet 65 is arranged to be moved in parallel with the pair of the guides 61, 62 by a not shown mechanism. When ultraviolet rays are exposed, the ink ribbon 53 stretched between the guides 61, 62 is pressed against the stamp making unit 7 side. In this case, the pair of the guides 61, 62 can be moved to the stamp making unit 7 side by a not shown spring or the like so that the parallel movement of the ribbon press sheet 65 is followed by the movement of the pair of the guides 61, 62.

Since the negative portion of the ink ribbon 53 is pressed against a transparent cover 72 of the stamp making unit 7 to be described later by the ribbon press sheet 65 in exposure as described above, there is no possibility that an irradiated light leaks to portions other than a necessary portion. Note, the ribbon press sheet 65 may be a rectangular frame having a rectangular opening defined at the center thereof which corresponds to the negative portion in place of the ultraviolet rays transmitting plate as described above.

Figure 4:
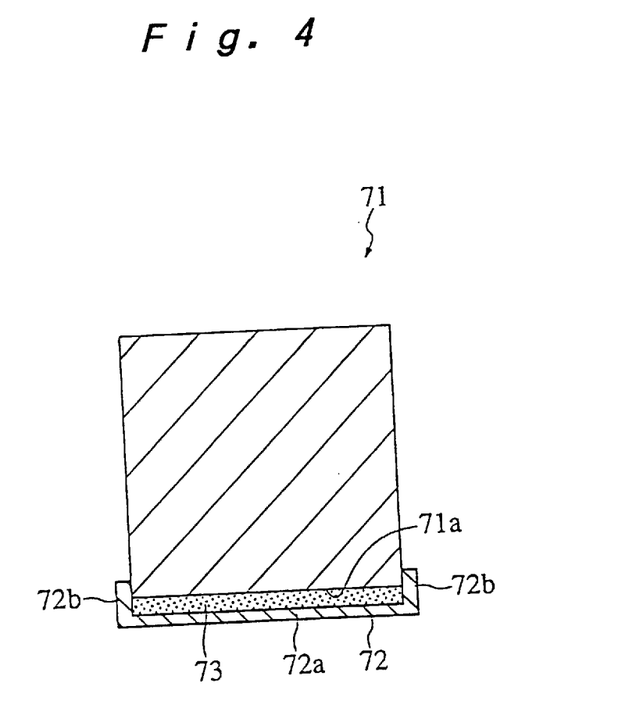
FIG. 4 is a plan view in cross section of the stamp making unit to be mounted to the cartridge of FIG. 3.

On the other hand, the stamp making unit 7 mounted to the opening 5a formed to the ribbon cartridge 5 is composed of a stack (stamp stock) 71, the transparent cover 72 covering the end surface 71a of the stamp stock 71 and a photosensitive resin 73 filled in a sealed space (filling space) between the end surface 71a of the stock 71 and the transparent cover 72 as shown in FIG. 4. The photosensitive resin 73 is composed of a liquid ultraviolet rays curing type resin having a property that it is changed (cured) from a liquid phase state to a solid phase state by receiving ultraviolet rays. The stock 71 is composed of resin, wood, metal or the like and acts as a grip of a finished stamp. The transparent cover 72 is composed of an ultraviolet rays transmitting resin (acrylic resin) or the like and includes a flat ceiling wall 72a and side walls 72b covering the four sides of the ceiling wall 72a to thereby form a rectangular-prism-shape sealed space between the end surface 72a of the stock 71 and it. The side walls 72b are inserted into the end of the stock 71 as well as caused to come into intimate contact therewith by a seal member or the like.

The end surface 71a of the stock 71 is formed to a rough surface by a surface treatment, a surface machining or the like so that the cured photosensitive resin 73 has an adhering force much greater than that of the resin on the inner peripheral surface of the ceiling wall 72a of the transparent cover 72. That is, since the inner peripheral surface of the transparent cover 72 is finished to a smooth surface and the end surface 71a of the stock 71 is finished to the rough surface, when the transparent cover 72 is removed from the stock 71 after the photosensitive resin 73 is cured, the photosensitive resin 73 remains on the stock 71 side.

Note, a lid open detection switch 66 for detecting whether the open/close lid 4a is opened or closed is disposed to the ribbon cartridge mounting unit 4 as shown in FIG. 3. Since the lid open detection switch 66 is associated with the opening/closing operation of the open/close lid 4a, when the open/close lid 4a is opened, the ultraviolet rays irradiating light source 63 is automatically turned off. With this arrangement, even if the open/close lid 4b is opened by mistake in the exposure of ultraviolet rays, or the like, since the ultraviolet rays irradiating light source 63 is automatically turned off, ultraviolet rays do not leak to the outside.

Next, a sequence for making a stamp by the stamp making apparatus 1 of the embodiment arranged as described above will be described.

First, a person for making the stamp opens the open/close lid 4a of the ribbon cartridge mounting unit 4 and mounts the ribbon cartridge 5 to the mounting recess 4b. Further, the person mounts the stamp making unit 7 to the opening 5a of the thus mounted ribbon cartridge 5 and thereafter closes the open/close lid 4a.

Next, the person inputs the characters of the print of seal (an image of seal) to be made through the key input unit 2. Since a group of the input characters is displayed on the display unit 3, it can be confirmed whether desired characters are input or not. After the group of the desired characters is input, print operation is instructed through the key input unit 2. With this instruction, a ribbon transfer/drive mechanism and a print control mechanism contained in the apparatus main body are operated and the ink ribbon 52 and the print paper ribbon 54 start to be fed as well as the heating body of the print head 57a is driven, so that print operation is executed to the ink ribbon 52 and the print paper ribbon 53 passing through the printing position 57.

As a result, although the characters of the print of seal are printed to the print paper ribbon 54 passing through the printing position 57, the ink of the ink ribbon 52 corresponding to the portion of the characters of the print of seal is transferred onto the print paper ribbon 54 and disappears from the ink ribbon 52. That is, the characters of the print of seal are printed to the print paper ribbon 54 and a negative film is formed to the portion of the ink ribbon 52 which corresponds to the characters of the print of seal and provided with an ultraviolet rays transmitting property. Thereafter, the print paper ribbon 54 is discharged to the outside of the apparatus through the discharge ports 51a, 4c and cut to a predetermined length by the cutter 4d. On the other hand, the ink ribbon 52 is further fed forward and stopped when the negative film formed portion thereof reaches the exposure position 60.

When the negative film formed portion of the ink ribbon 52 reaches the exposure position 60, the ribbon press sheet 65 makes a parallel movement first to cause the negative film formed portion of the ink ribbon 52 stretched between the pair of the guides 61, 62 to come into intimate contact with the surface of the transparent cover 72 of the stamp making unit 7. Thereafter, the ultraviolet rays irradiating light source 63 is turned on and the photosensitive resin 73 sealed in the stamp making unit 7 is exposed to ultraviolet rays for a predetermined period of time through the transparent cover 72 using the negative film portion of the ink ribbon 52 as a mask. With this operation, the exposed portion of the photosensitive resin 73 is cured and changed from a liquid to a solid as well as an uncured portion remains unchanged as the a liquid. Thus, the cured portion corresponding to the characters of the print of seal is formed to the photosensitive resin 73. Then, after the completion of the exposure, the ribbon press sheet 65 retracts to its initial position again. As a result, the pair of the guides 61, 62 also return to their initial position.

Thereafter, the operator opens the open/close lid 4a and takes out the stamp making unit 7 from the mounting recess 4b. Then, the operator removes the transparent cover 72 from the stamp making unit 7. Since the adhering force of the photosensitive resin 73 to the transparent cover 72 is much smaller than that of the photosensitive resin 73 to the end surface 71a of the stock 71, the photosensitive resin 73 remains in the state that it is adhered to the stock 71 and only the transparent cover 72 can be simply removed. When the transparent cover 72 is removed, the unexposed portion of the photosensitive resin 73 naturally flows out and only the cured portion remains. Note, the uncured portion is perfectly removed by being washed away with a liquid such as water or the like.

As a result, only the cured portion of the photosensitive resin 73 remains, thus a letterpress stamp face (the face of a seal) corresponding to the characters of the print of seal can be obtained. A stamp unit (stamp) to which the letterpress stamp face of the desired characters of the print of seal can be obtained from the stamp making unit 7 as described above. Note, to display the characters of the print of seal of the stamp unit, the print paper ribbon on which the aforesaid characters of the print of seal are printed is attached to the back surface of the stock 71.

When the stamp making unit 7 of the embodiment is used as described above, since the uncured portion is composed of the liquid, a job for washing away the exposed photosensitive resin 73 can be very simply carried out in a short time in such a manner as to apply flowing water to the uncured portion. Further, a disadvantage such as the damage of the letterpress stamp face, and the like can be prevented in the washing away job. Note, although the photosensitive resin 73 which is cured by ultraviolet rays is used in the embodiment, it is needless to say that other photosensitive resins which are curable by a light having a wavelength other than that of ultraviolet rays may be used so long as they are liquids in a steady state.

Further, since the inner peripheral surface of the transparent cover 72 is made to the smooth surface and the end surface 71a of the stock 71 is made to the rough surface in the embodiment, when the transparent cover 72 is removed from the stock 71, the photosensitive resin 73 is prevented from being adhered to the transparent cover 72 and removed. Note, the smooth surface finishing and the rough surface finishing of both the members may be made by any surface treatment or surface machining so long as they are treated to cause the photosensitive resin 73 to securely remain on the stock 71 side.

Although the end of the transparent cover 72 is joined to the stock 71 by a seal member or the like so that they are in intimate contact with each other as a structure for sealing the a liquid photosensitive resin 73 in the embodiment, the seal structure may be achieved by methods other than the above. For example, the periphery of the transparent cover 72 may be sealed using an adhesive tape. The leakage of the photosensitive resin 73 may be prevented by adjusting the viscosity of the photosensitive resin 73 to be sealed itself in place of the above seal structures or in combination therewith.

Further, since the transparent cover 72 with which the liquid photosensitive resin 73 is filled is composed of a material having a good ultraviolet rays transmitting property and a low refraction factor in the embodiment, there can be obtained the letterpress stamp face having the print of seal of high quality without the deformation (expansion toward a lower portion, thinning) of a convex portion, and the like.

Figure 5:
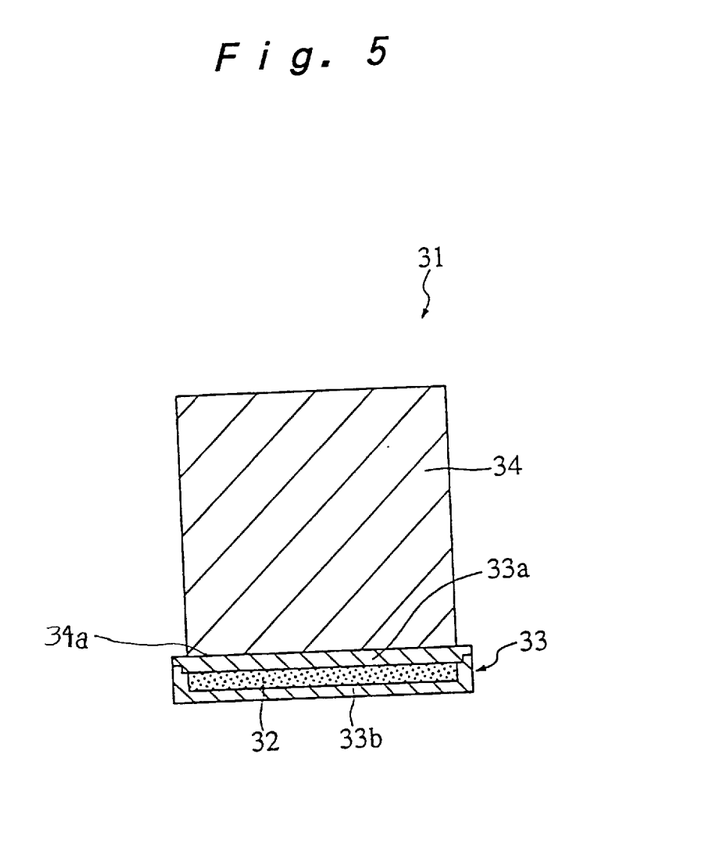
FIG. 5 is a plan view in cross section showing a second embodiment of the stamp making unit.

Next, another embodiment of the stamp making unit will be described with reference to FIG. 5. A stamp making unit 31 of the embodiment has a vessel 33 filled with a photosensitive resin 32 and mounted to a stock 34 through the vessel 33. The vessel 33 is composed of a base portion 33a secured to the end surface 34a of the stock 34 and a vessel main body 33b detachably mounted to the base portion 33a. The vessel main body 33b is used in place of the above transparent cover and composed of a resin or the like having a good ultraviolet rays transmitting property. Further, the inner surface of the vessel main body 33b is smoothly finished and the surface of the base portion 33a is roughly finished.

The photosensitive resin 73 is exposed to a light using the negative film portion of an ink ribbon 52 as a mask also in this case. With this operation, the exposed portion of the photosensitive resin 73 is cured and changed from a liquid to a solid as well as the unexposed portion thereof remains unchanged as the a liquid. When the cured portion is formed to the photosensitive resin 73 in correspondence to the characters of a print of seal as described above, the vessel main body 33b of the vessel 33 is removed and the uncured portion is perfectly removed by being washed away with water.

Since the photosensitive resin 32 is sealed in the vessel 33 in the embodiment, the photosensitive resin 32 can be handled by an improved manner.

Figure 6:
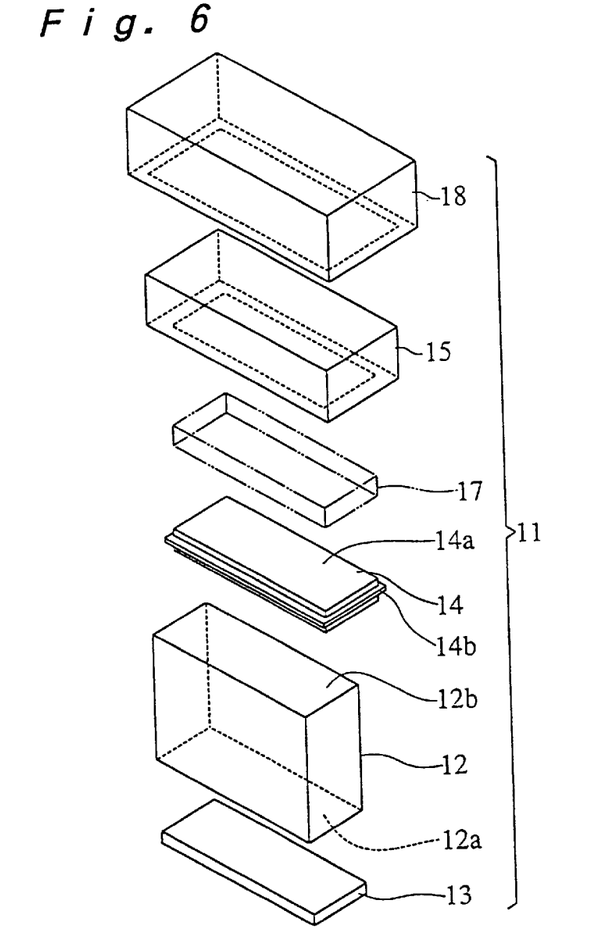
FIG. 6 is an exploded perspective view showing a third embodiment of the stamp making unit of the present invention.
Figure 7:
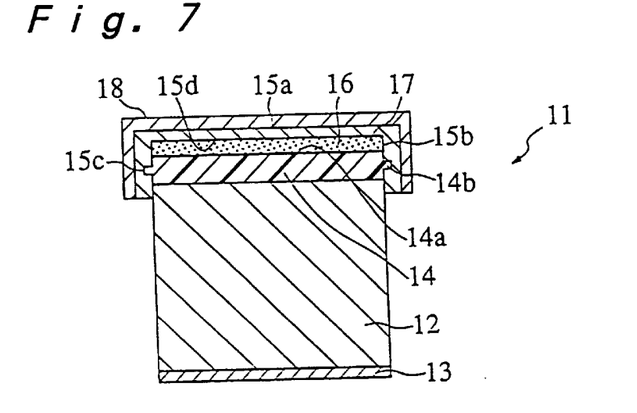
FIG. 7 is a plan view in cross section of the stamp making unit of FIG. 6.

Still another embodiment of the stamp making unit will be described with reference to FIG. 6 and FIG. 7. A stamp making unit 11 of the embodiment includes a rectangular-prism-shaped stamp stock 12 composed of resin, wood, metal or the like. An original image 13 showing the characters of a print of seal to be formed to the stamp making unit 11 is attached to the end surface 12a of the stamp stock 12 on the back surface side thereof and a rubber sheet 14 having a certain thickness is attached to an end surface 12b of the stock 12 on the front side thereof. Further, a light transmitting cover member 15 is attached to the rubber sheet 14 so as to cover the surface 14a thereof.

The cover member 15 is composed of a material having an ultraviolet rays transmitting property and a low refraction factor. The cover member 15 has a rectangular shape with an opening defined to the cover member 15 side thereof and integrally formed by a ceiling wall 15a and four side walls 15b around it. Locking grooves 15c are formed to the inner peripheral surface of the side walls 15b and projections 14b to be engaged with the locking grooves 15c are formed to the outer peripheral surface of the rubber member 14. When the cover member 15 is attached to the rubber member 14 so that the locking grooves 15c are engaged with the projections 14b, the surface 14a of the rubber member 14 confronts the ceiling wall 15a of the cover member 15 in parallel with each other through a certain interval defined therebetween so that a sealed space (filling space) 16 having a certain thickness is partitioned and formed between the surface 14a of the rubber member 14 and the inner peripheral surface 15d of the cover member 15 as shown in FIG. 7.

An ultraviolet rays curing type photosensitive resin 17 whose light receiving portion is changed from a liquid to a solid is filled in the sealed space 16 in a water tight state. In this case, the surface 14a of the rubber member 14 is finished to a rough surface by honing or the like, whereas the inner peripheral surface 15d of the transparent cover member 15 is smoothly finished. Thus, when the photosensitive resin 17 is exposed and cured, the adhering force of the photosensitive resin 17 to the rubber member 14 is much greater than that to the cover member 15.

Further, a light shading cap member 18 is detachably mounted to the cover member 15. When the stamp making unit 11 is transported or stored, the photosensitive resin 17 can be prevented from being cured by mounting the cap member 18.

When a stamp is made by the stamp making unit 11, there are employed a stamp making apparatus provided with an image reading mechanism for reading the original image 13, a negative film making mechanism for making a negative film of a read image, and an exposure mechanism for exposing the photosensitive resin 17 using the negative film. The negative film making mechanism and the exposure mechanism are arranged similarly to those of the above embodiments. Further, the image reading mechanism can be simply arranged using one-dimensional sensor such as a CCD or the like.

In this case, a person for making the stamp prepares the stamp making unit 11 to which the original image 13, on which desired characters of a print of seal is drawn, is attached. Then, the original image 13 is read and a negative film portion corresponding to it is formed to an ink ribbon 52. Next, the photosensitive resin 17 sealed in the stamp making unit 11 is exposed for a predetermined period of time by the exposure mechanism through the transparent cover member 15 using the negative film portion as a mask. As a result, the exposed portion of the photosensitive resin 17 is cured and changed from the liquid to the solid. Further, an unexposed portion remains unchanged as the liquid. As a result, the cured portion is formed to the photosensitive resin 17 in correspondence to the characters of the print of seal.

Thereafter, the transparent cover member 15 is removed from the stamp making unit 11. When the cover member 15 is removed, the unexposed portion flows out and only the cured portion remains. Further, the uncured portion is perfectly washed away and removed. With this operation, only the cured portion of the photosensitive resin 17 remains and a letterpress stamp face corresponding to the characters of the print of seal can be obtained. A stamp unit (stamp) to which the letterpress stamp face of the desired characters of the print of seal is formed can be obtained from the stamp making unit 11 by the method as described above.

The stamp making unit 11 of the embodiment can achieve the same advantage as that of the above stamp making units 7, 31.

This embodiment is advantageous in that operability and feeling in operation are improved when the stamp is affixed because the rubber member 14 is inserted between the stock 12 and the photosensitive resin 17. However, the sealed space 16 to be filled with the photoconductive resin 17 may be defined between the end surface 12b of the stock 12 and the cover member 15 omitting the rubber member. Further, although the projections 14b formed to the outer peripheral surface of the rubber member 14 are used as the seal mechanism of the photosensitive resin 17, the seal mechanism may be made by methods other than the above. For example, a seal material or the like may be applied to the portion of the transparent cover member 5 to be joined to the rubber member 14.

Further, since the light shading cap member 18 is mounted in the embodiment, even if the stamp making unit 11 is stored for a long time, the photosensitive resin 17 can be prevented from being cured or deteriorated by being exposed to a light.

Figure 8:
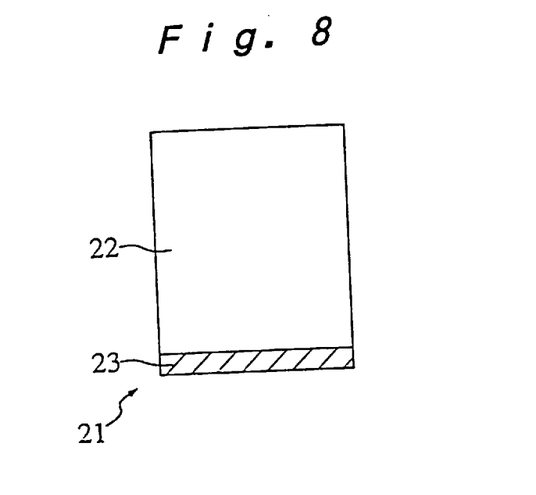
FIG. 8 is an arrangement view showing a fourth embodiment of the stamp making unit of the present invention.
Figure 9:
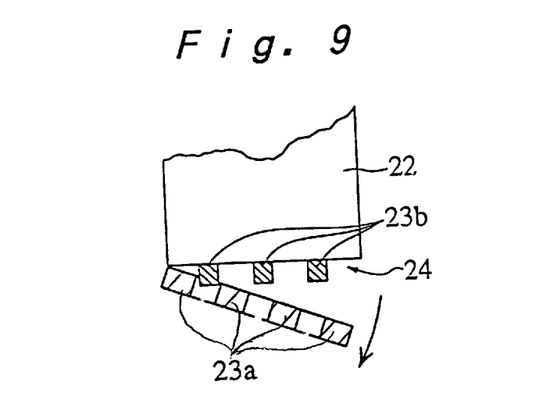
FIG. 9 is a view explaining the state that the uncured portion of the stamp making unit of FIG. 8 is removed.

Next, a further embodiment of the stamp making unit of the present invention will be described with reference to FIG. 8 and FIG. 9. A stamp making unit 21 of the embodiment is composed of a stock 22 and an ultraviolet rays curing type photosensitive resin 23 attached to an end of the stock 22. The embodiment has a feature that the photosensitive resin 23 is not a liquid but a gel which is in an intermediate state between a liquid and a solid and has a viscosity necessary to maintain its configuration.

In the stamp making unit 21, the photosensitive resin 23 is exposed to a light and partially cured using a negative film corresponding to the characters of a print of seal. After the photosensitive resin 23 is cured, the uncured portion 23a of the photosensitive resin 23 is separated from the cured portion 23b thereof by being exfoliated therefrom as shown in FIG. 9. With this operation, a letterpress stamp face 24 composed of the cured portion can be obtained.

Since the uncured portion 23a can be separated from the cured portion 23b by being exfoliated therefrom in the stamp making unit 21 of the embodiment as described above, a washing away job using a fluid or the like is not needed. Further, a cover, a vessel and the like for sealing the photosensitive resin 23 are not necessary, the number of parts can be reduced accordingly.

INDUSTRIAL APPLICABILITY

As described above, the stamp material, the stamp making method and the stamp of the present invention are suitable for very simply making a stamp having an excellent face of a seal without the need of skill.

We claim:

1. A stamp material comprising:
   a face of a seal forming member having a liquid photosensitive resin which is changeable to a solid in response to a received light;
   a cover member including a light transmitting member detachably attached to said stamp stock; and
   a stamp stock for holding said face of a seal forming member.

2. A stamp material according to claim 1, wherein said face of a seal forming member further includes a light shading member detachably shielding said cover member.

3. A stamp material according to claim 1, wherein a contact surface of said stamp stock and a contact surface of said cover member are arranged such that an adhering force of said photosensitive resin having changed to a solid to said contact surface of said stamp stock is greater than that of said photosensitive resin to said contact surface of said cover member.

4. A stamp material according to claim 3, wherein said face of a seal forming member further includes a light shading member for detachably shielding said cover member.

5. A stamp material according to claim 1, wherein an elastic member is interposed between said stamp stock and said face of a seal forming member.

6. A stamp material according to claim 5, wherein said face of a seal forming member further includes a light shading member detachably shielding said cover member.

7. A stamp material according to claim 1, wherein said face of a seal forming member is fixed to said stamp stock through a light transmitting filling vessel filled with said photosensitive resin in a water tight state and said filling vessel includes a vessel base portion attached to said stamp stock and a vessel main body detachable from said vessel base portion.

8. A stamp material according to claim 7, wherein said face of a seal forming member further includes a light shading member for detachably shielding said vessel main body.

9. A stamp material according to claim 7, wherein a contact surface of said vessel base portion and a contact surface of said vessel main body are arranged such that an adhering force of said photosensitive resin having been changed to a solid to said contact surface of said vessel base portion is greater than that of said photosensitive resin to said contact surface of said vessel main body.

10. A stamp material according to claim 9, wherein said face of a seal forming member further includes a light shading member for detachably shielding said vessel main body.

11. A stamp material according to claim 7, wherein an elastic member is interposed between said stamp stock and said face of a seal forming member.

12. A stamp material according to claim 11, wherein said face of a seal forming member further includes a light shading member for detachably shielding said vessel main body.

13. A stamp material according to claim 1, wherein said light comprises ultraviolet rays and said photosensitive resin comprises an ultraviolet rays curing resin.

14. A stamp material according to claim 13, wherein an elastic member is interposed between said stamp stock and said face of a seal forming member.

15. A stamp material according to claim 1, wherein an elastic member is interposed between said stamp stock and said face of a seal forming member.

16. A stamp material according to claim 1 wherein said face of a seal forming member further includes a cover member for forming a filling space capable of being filled with said liquid photosensitive resin in a water tight state between said face of a seal forming member and said stamp stock.

17. A stamp material, comprising:
  a face of a seal forming member having a gel photosensitive resin which is changeable to a solid in response to a received light;
  a light shading member for detachably shielding said photosensitive resin; and
  a stamp stock for holding said face of a seal forming member.

18. A stamp material according to claim 17, wherein an elastic member is interposed between said stamp stock and said face of a seal forming member.

19. A stamp material according to claim 17, wherein said light comprises ultraviolet rays and said photosensitive resin comprises an ultraviolet rays curing resin.

20. A stamp material according to claim 19, wherein an elastic member is interposed between said stamp stock and said face of a seal forming member.

21. A stamp material according to claim 17, wherein an elastic member is interposed between said stamp stock and said face of a seal forming member.

22. A stamp making method executed by using a stamp material comprising a face of a seal forming member having a liquid photosensitive resin which is changeable to a solid in response to a received light and a stamp stock for holding said face of a seal forming member comprising:
  a bonding step for securing said seal forming member to said stamp stock;
  an exposing step for subjecting said liquid photosensitive resin to an exposure having a shape corresponding to an image of a print of a seal and changing an exposed portion of said liquid photosensitive resin to a solid, said exposing step occurring after said bonding step; and
  a removing step for removing an unexposed portion of said liquid photosensitive resin while leaving said exposed portion changed to a solid.

23. A stamp making method according to claim 22, wherein said exposing step executes said exposure using a negative film on which an image of said print of a seal is formed as a mask.

24. A stamp making method according to claim 23, wherein said exposure is executed using ultraviolet rays and said photosensitive resin comprises ultraviolet rays curing resin.

25. A stamp making method according to claim 22, wherein said exposure is executed using ultraviolet rays and said photosensitive resin comprises an ultraviolet rays curing resin.

26. A stamp making method according to claim 22 wherein said face of a seal forming member further includes a cover member for forming a filling space capable of being filled with said liquid photosensitive resin in a water tight state between said face of a seal forming member and said stamp stock.

27. A stamp making method executed by using a stamp material comprising a face of a seal forming member having a gel photosensitive resin which is changeable to a solid in response to a received light and a stamp stock for holding said face of a seal forming member, comprising:
  a bonding step for securing said seal forming member to said stamp stock;
  an exposing step for subjecting said gel photosensitive resin to an exposure having a shape corresponding to an image of a print of a seal and changing an exposed portion of said gel photosensitive resin to a solid, said exposing step occurring after said bonding step; and
  a removing step for removing an unexposed portion of said gel photosensitive resin while leaving said exposed portion changed to a solid.

28. A stamp making method according to claim 27, wherein said exposing step executes said exposure using a negative film on which an image of said print of a seal is formed as a mask.

29. A stamp making method according to claim 28, wherein said exposure is executed using ultraviolet rays and said photosensitive resin comprises an ultraviolet rays curing resin.

30. A stamp making method according to claim 27, wherein said exposure is executed using ultraviolet rays and said photosensitive resin comprises an ultraviolet rays curing resin.

31. A stamp making method according to claim 27 wherein said face of a seal forming member further includes a light shading member detachably shielding said gel photosensitive resin.

32. A stamp having a face of a seal comprising a photosensitive resin which is changed from a liquid to a solid by being subjected to an exposure having a shape corresponding to an image of a print of a seal, said face of a seal being secured to a stamp stock when said photosensitive resin is said liquid and said solid.

33. A stamp having a face of a seal comprising a photosensitive resin which is changed from a gel to a solid by being subjected to an exposure having a shape corresponding to an image of a print of a seal, said face of a seal being secured to a stamp stock when said photosensitive resin is said gel and said solid.

* * * * *